(12) United States Patent
Szwec et al.

(10) Patent No.: US 6,739,202 B2
(45) Date of Patent: May 25, 2004

(54) METHOD AND APPARATUS FOR NON-DESTRUCTIVE TESTING OF LEADED PACKAGES

(75) Inventors: Richard James Szwec, Roanoke County, VA (US); Edward Hunt Donoho, Roanoke, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 240 days.

(21) Appl. No.: 09/882,068

(22) Filed: Jun. 18, 2001

(65) Prior Publication Data
US 2002/0189364 A1 Dec. 19, 2002

(51) Int. Cl.⁷ ................................................. G01N 3/08
(52) U.S. Cl. .............................................. 73/827; 73/831
(58) Field of Search .......................... 73/818, 827, 830, 73/834, 831

(56) References Cited

U.S. PATENT DOCUMENTS

| | | | | |
|---|---|---|---|---|
| 4,677,370 A | * | 6/1987 | Tustaniwskyj et al. | 324/522 |
| 4,907,458 A | * | 3/1990 | Biggs et al. | 73/827 |
| 5,085,084 A | * | 2/1992 | Salatino | 73/827 |
| 5,753,823 A | * | 5/1998 | Chang et al. | 73/842 |
| 5,836,071 A | * | 11/1998 | Falcone et al. | 29/593 |
| 6,068,174 A | * | 5/2000 | Ball et al. | 228/4.5 |
| 6,230,569 B1 | * | 5/2001 | Ball | 73/827 |

\* cited by examiner

Primary Examiner—Edward Lefkowitz
Assistant Examiner—Lilybett Martir
(74) Attorney, Agent, or Firm—Edell Shapiro & Finnan LLC; Martin Abramson

(57) ABSTRACT

A method of non-destructively testing the adhesion of electrical leads joined to a package comprising the steps of holding the package and a portion of a lead in respective stationary positions, applying a force to the lead proximate an area where it's joined to the package, and measuring the resistance of the lead to the force. An apparatus for holding the package and leads during such testing comprising first and second holding members, each having three arms connected by a transverse member.

6 Claims, 6 Drawing Sheets

METHOD AND APPARATUS FOR NON-DESTRUCTIVE TESTING OF LEADED PACKAGES

FIELD OF THE INVENTION

The present invention is directed to the testing of packages bearing electrical leads (leaded packages).

BACKGROUND OF THE INVENTION

Electronic systems or components, which may be in the form of integrated circuits, are frequently housed in packages having electrical leads which allow interconnection of the package contents to other circuitry. Such packages are frequently made of ceramic, in which case the conductive leads are brazed to the ceramic package.

In some cases, empty ceramic packages having no electronics inside are provided to a manufacturer, who fills them with electronics and sells the completed package. In other cases, the packages may be filled by their manufacturer. In either case, it is desirable to be able to test the adhesion of the leads to the package to ensure that the leads do not produce an open circuit during installation of the package, or during operation.

A prior art method of testing such packages involved pulling the leads to the point of failure, i.e. destructive testing. A certain number of packages in each lot would be so tested, and if a predetermined threshold number failed, the entire lot would be rejected.

A problem with the prior art is that many good packages which could be used are rejected and discarded. This is expensive and causes production delays, in that replacement packages must be provided. For example, if an electronics manufacturer is provided with empty packages from a vendor and an entire lot is rejected, it must await replacement packages before it can fill such packages with electronic modules and meet its sales or delivery commitments.

It is therefore desirable to provide a non-destructive method by which every package can be tested. In this way, only defective packages will be discarded, and packages which pass the test will be used.

SUMMARY OF THE INVENTION

It is an object of the present invention to provide a method and apparatus for non-destructively testing leaded packages.

In accordance with the invention, the above object is provided by employing a method of testing a leaded package comprising the steps of, holding the package and a portion of the lead in respective stationary positions, applying a force to the lead proximate an area where its joined to the package, and measuring the resistance of the lead to the force.

BRIEF DESCRIPTION OF THE DRAWINGS

The invention will be better appreciated by referring to the accompanying drawings, wherein.

DETAILED DESCRIPTION OF PREFERRED EMBODIMENTS

Figure 1:
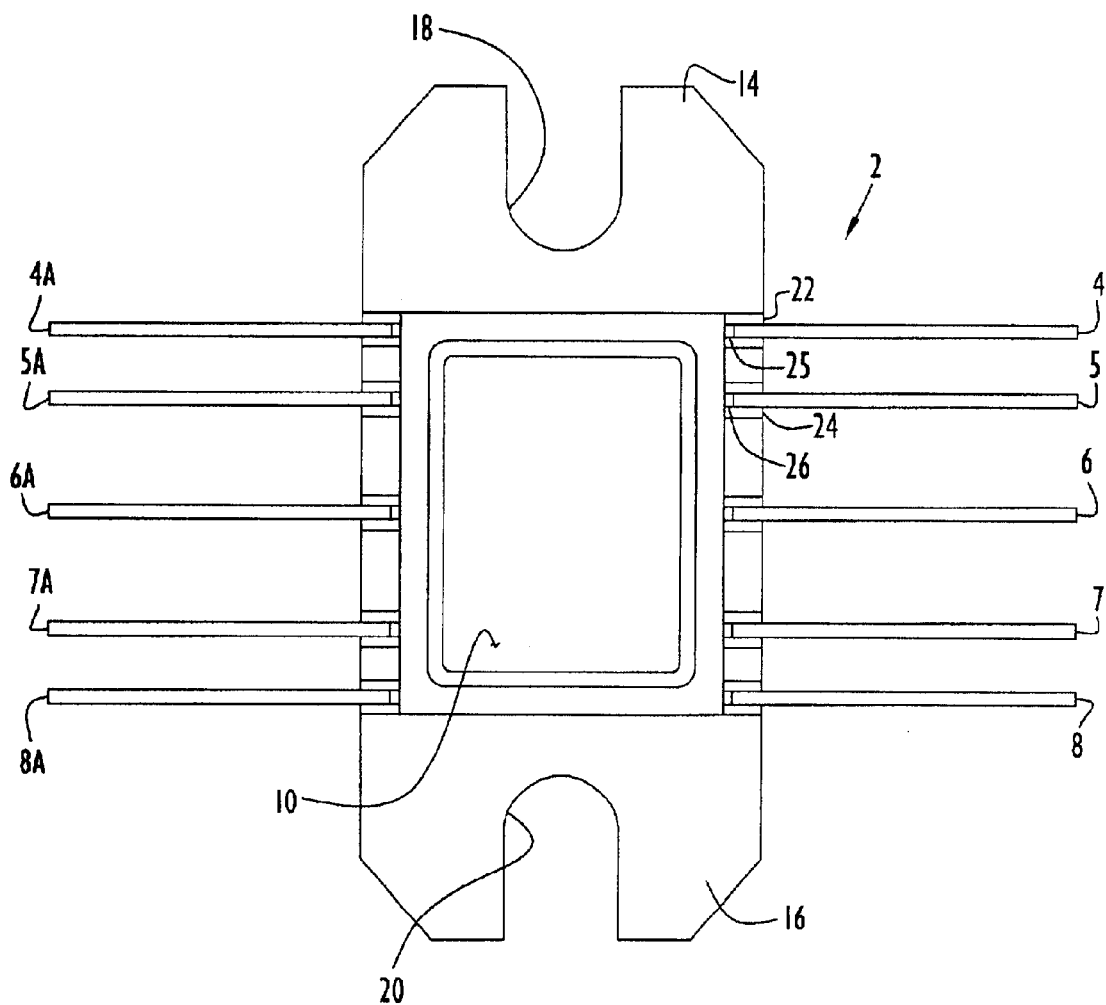
FIGS. 1 and 2 show an example of a leaded package.

Referring to FIG. 1, a plan view of an example of a leaded package 2 is shown. In the Figure, leads 4, 5, 6, 7 and 8 as well as opposing leads 4A, 5A, 6A, 7A and 8A are joined to the package. For example, lead 4 is joined to the package at area 22, whereas lead 5 is joined to the package at area 24. The leads 4 and 5 may be joined to respective conductors 25 and 26 at areas 22 and 24 (sometimes known as pads) by any known joining process such as soldering, welding, brazing, etc. Although ceramic is widely used as a material for the packages, packages made of other materials are also encompassed by the invention. The respective leads are for different functions depending on the particular electronic modules in the package. By way of example, in the case of communications circuitry, leads 4, 4A and 8, 8A might be power leads while leads 6, 6A might be signal leads. Additionally, the package 2 may be openable and closeable with cover 10, so that after the testing described herein the cavity of the package may be filled with circuitry by an electronics manufacturer and then closed. The package may have mounting tabs 14 and 16 as shown, which are provided with mounting openings 18 and 20 respectively.

Figure 2:
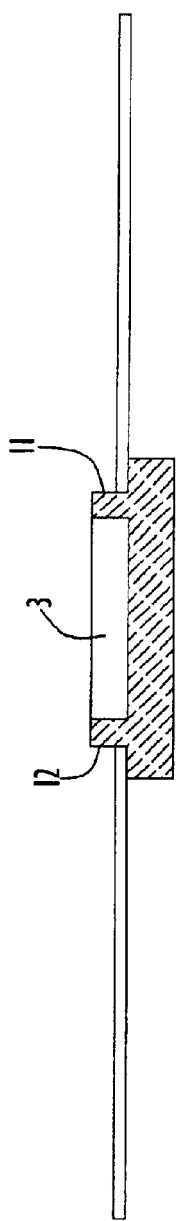

FIG. 2 is a sectional view of the package which shows walls 11 and 12, which define cavity 3 along with walls perpendicular to walls 11 and 12 (not shown).

In accordance with the method of the invention, a leaded package is non-destructively tested for lead adhesion by holding the package and a portion of a lead in respective stationary positions, applying a force to the lead proximate an area where it's joined to the package, and measuring the resistance of the lead to the force.

Figure 3:
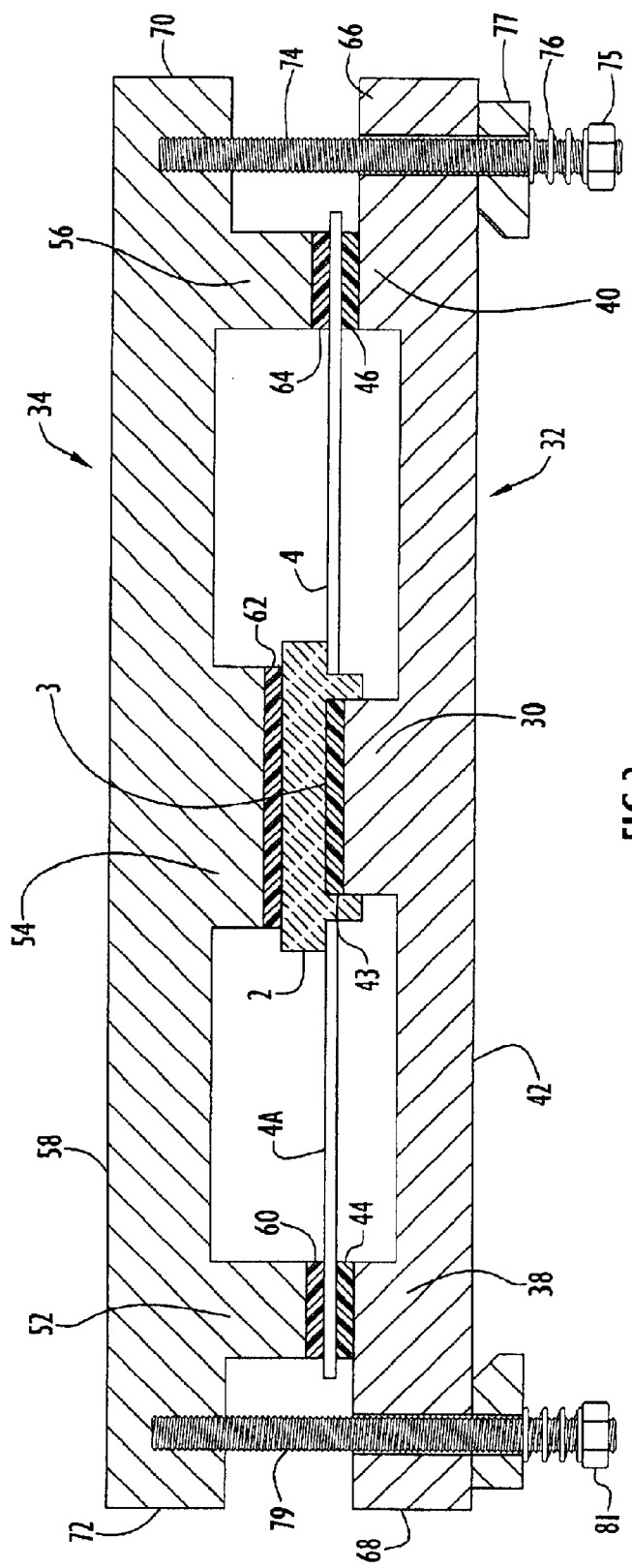
FIGS. 3, 4 and 6 show an embodiment of the apparatus of the invention.
Figure 4:
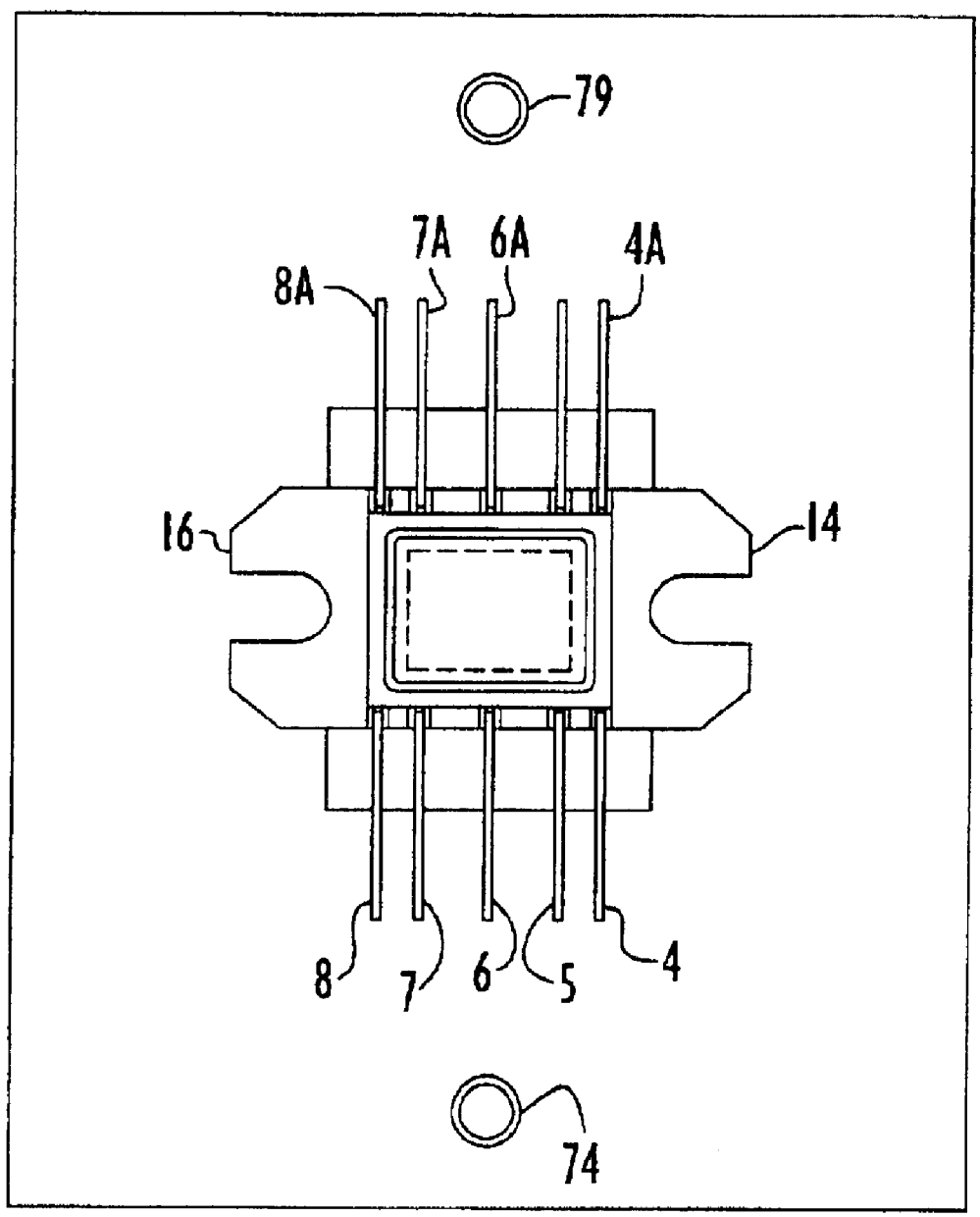
Figure 6:
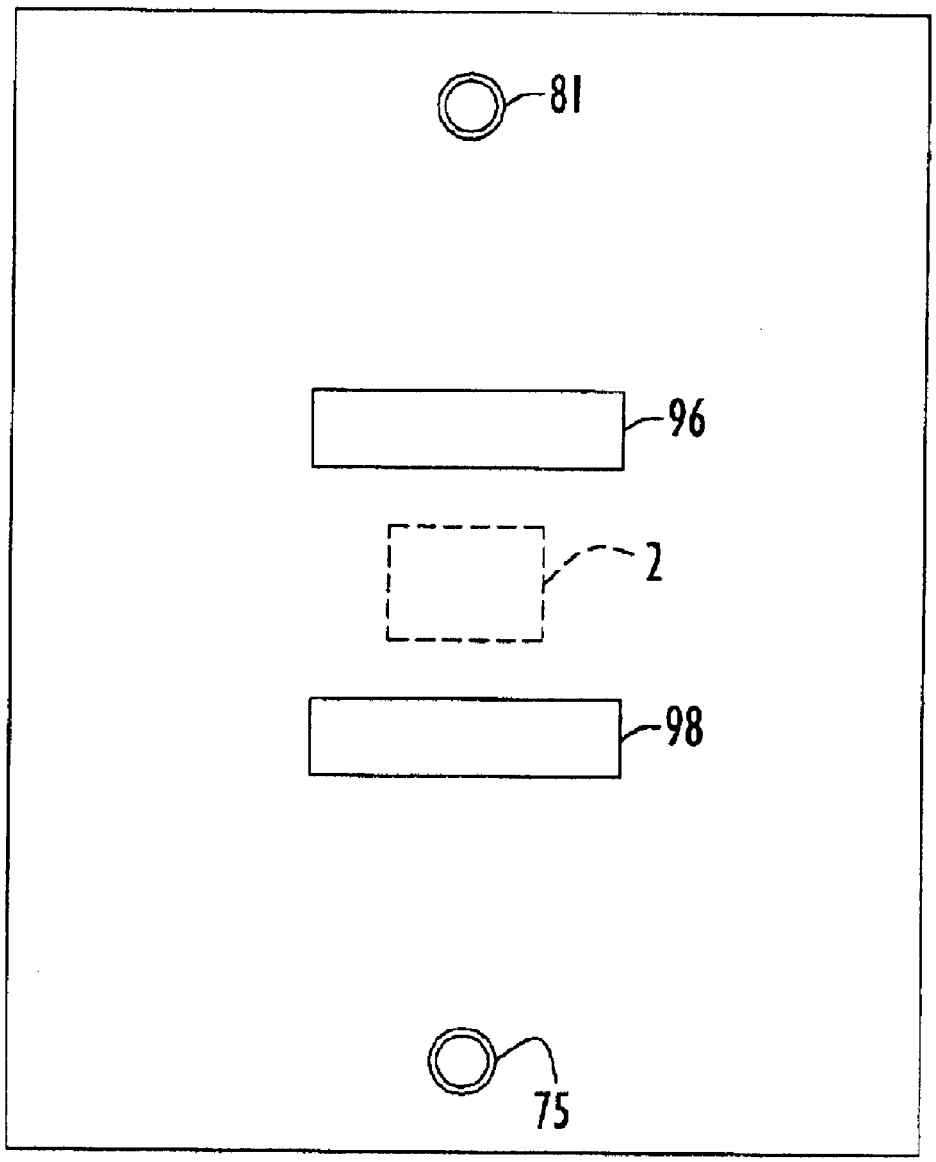

In accordance with the apparatus of the invention, a holding device for holding the package and leads in respective stationary positions is employed. Various implementations of a holding device for holding the package and leads stationary are possible and fall within the scope of the present invention. However, a preferred embodiment of such a device, is shown in FIGS. 3, 4 and 6.

The embodiment depicted is for testing an unfilled package, i.e. if the package passes the test it is filled with one or more electronic modules. Hence, referring to the sectional view of FIG. 3, package 2 has a central cavity 3 into which arm 30 of the holding device projects. It is this central cavity which is filled with the electronics after testing, and then covered. The holding device is comprised of first and second holding members 32 and 34, which are separable from each other at least partially to allow for the loading and unloading of packages, and are closeable with respect to each other so as to firmly hold a package and leads in respective stationary positions therebetween.

Holding member 32 is comprised of arms 30, 38 and 40, and transverse member 42 which connects the arms. Each arm ends in a discrete area which includes compliant material such as a rubber pad, such being denoted by reference numbers 43, 44 and 46. Similarly, holding member 34 is comprised of arms 52, 54 and 56, which are connected by transverse member 58, pads 60, 62 and 64 of compliant material being present at the end of each arm.

Holding member 32 has threaded projections 66 and 68 at respective ends, while holding member 34 has similar threaded projections 70 and 72. A locking screw 74 is threaded through projections 66 and 70. The locking screw has a nut 75 at its end and compressible means such as spring 76, as well as a wedge 77, between the nut and the abutment formed by the underside of projection 66. The nut 75 is tightened in order to close the two holding members with respect to each other so as to hold the package and leads therebetween. A similar locking screw 79 nut 81 and associated components, are present at the other end.

Referring to FIG. 3, in order to insert a package and leads into the device, the locking screws 74 and 79 would be loosened so as to cause separation of the holding members. If desired, an E-clip or similar mechanical expedient could be inserted in projections 70 and 72 to prevent the two holding members from becoming detached from each other. In the embodiment shown, the leads are held at their end regions between arms 40 and 56, and 38 and 52. As mentioned above, the holding device can take different forms, and for example could be arranged to hold only a single lead at a time rather than opposing leads, or to grip the leads closer to the package. After the test is performed, the holding members are separated to allow removal of the package or positional readjustment thereof.

FIG. 4 is a view of the FIG. 3 device at the level of the leads. In the embodiment depicted, all of the leads may be held between the holding members at the same time.

Figure 5:
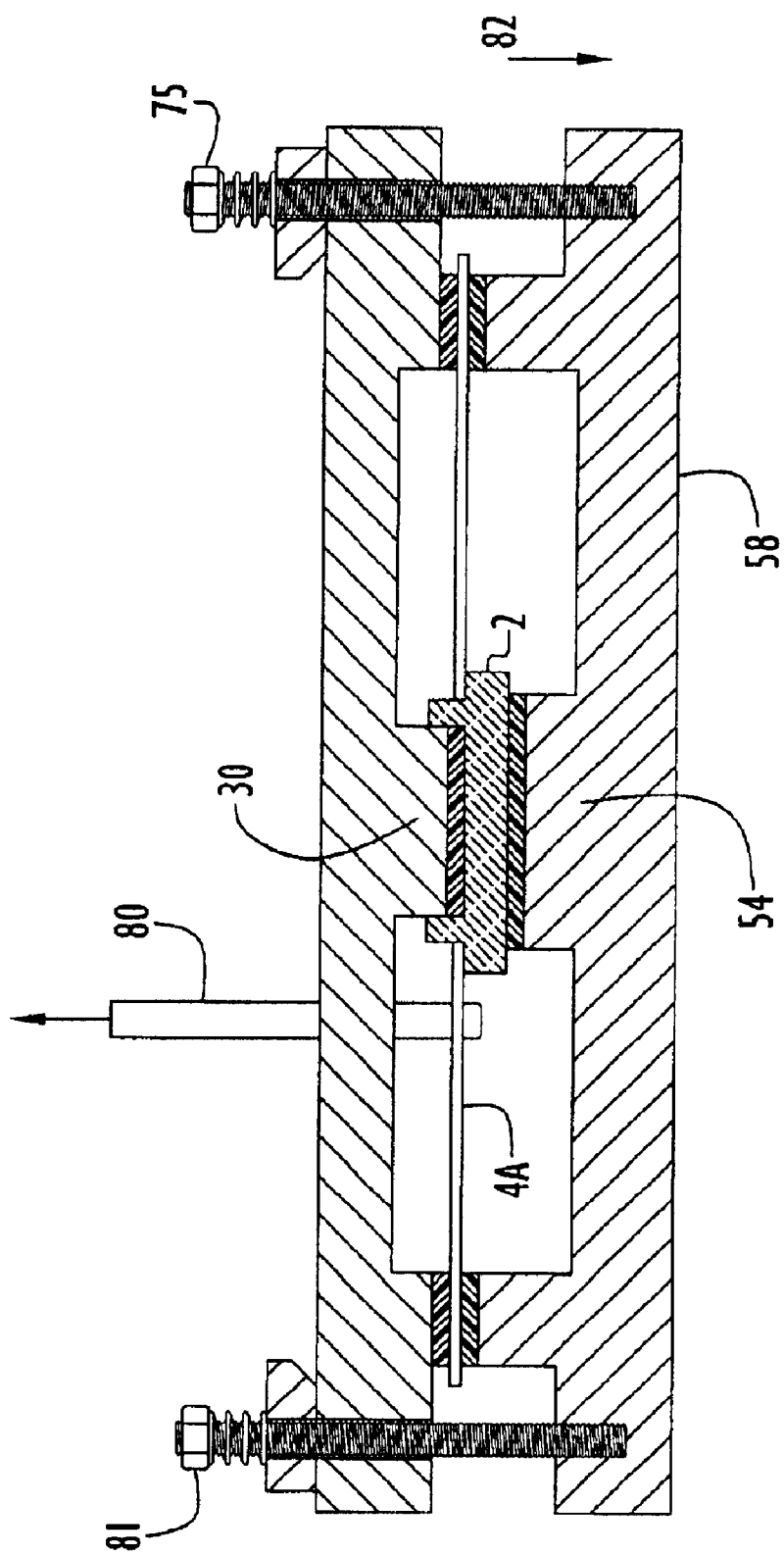
FIGS. 5 and 7 depict an embodiment for practicing the method of the invention.

Referring to FIG. 5, the holding device of FIG. 3 is positionally inverted (turned upside down) and the lead 4A is pulled by pulling member 80 at an area proximate where the lead is joined to the package, while the entire assembly is prevented from moving upwardly, as depicted by force arrow 82. Alternatively, the lead may be pushed, for example, by not inverting the holding device from its FIG. 3 position, and pushing the lead from the top.

FIG. 6 is a plan view of the apparatus and shows windows 96 and 98 through which a pulling or pushing member may be inserted to test each of the multiple leads which are simultaneously held by the holding members.

Figure 7:
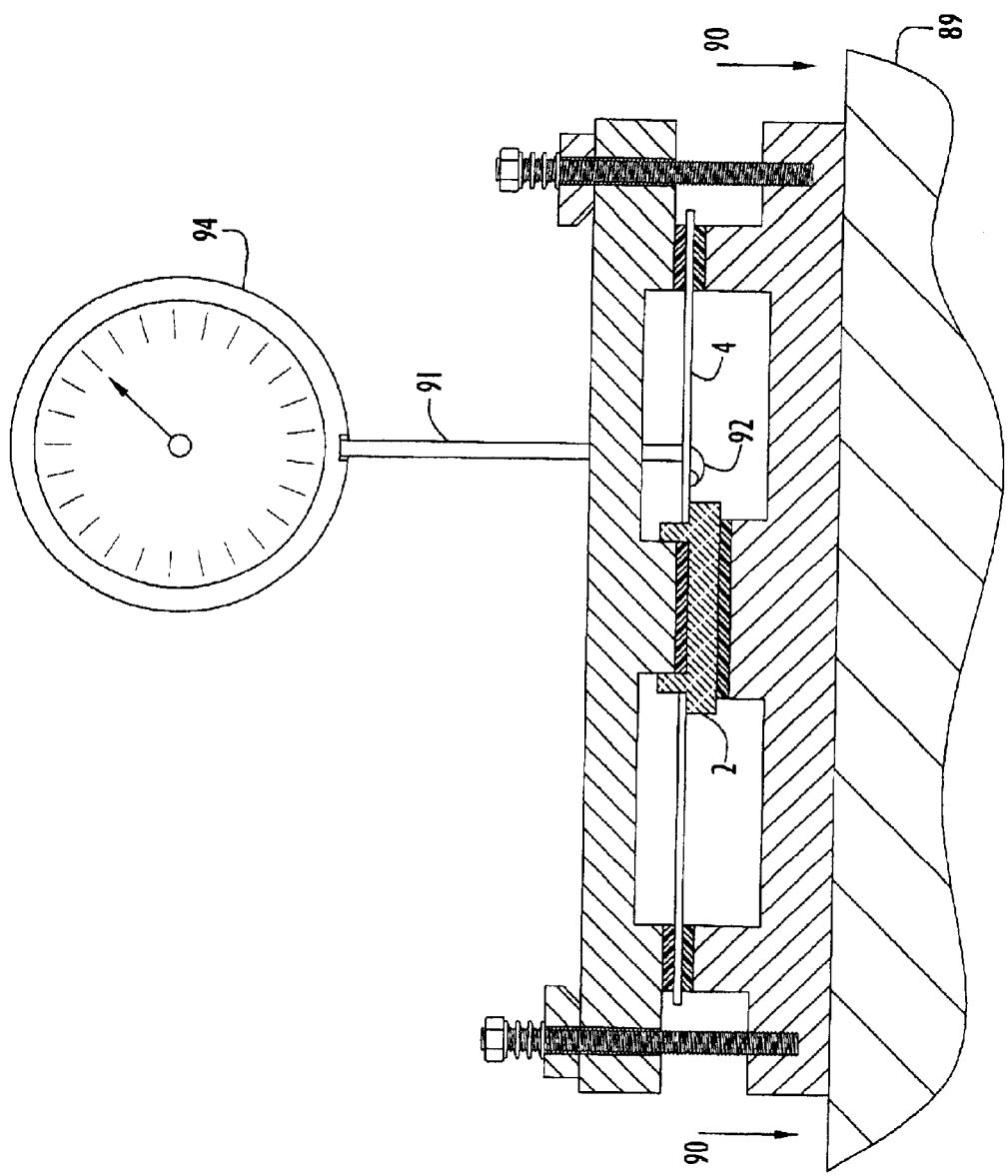

FIG. 7 depicts the practice of an embodiment of the method of the invention. The device shown in the preceding figures is installed in a standard semiconductor lead pulling machine 89 such as a BT2400 by Dage Precision Industries, Fremont, Calif. Such machine 89 includes mechanical means for preventing movement of the holding device during the lead pulling operation, as represented by force arrows 90 in FIG. 7.

The machine is also provided with a pulling member 91 having a hook 92 atone end for engaging the lead 4. The other end of the pulling member is connected to force gauge 94, which measures the resistance of the lead to the pulling force. The difference in resistance between a lead which is well adhered to the package and one which is poorly adhered may be substantial. Thus, with one type of package tested, a well adhered lead registered a resistance of one or two pounds, while a poorly adhered lead registered a resistance of only a few ounces. A package with a poorly adhered lead would be rejected.

While in the implementation of the invention depicted, loading and unloading of the packages from the holding device is manual, such procedure, as well as the lead pulling or pushing and reading of the gauge, can be fully automated so as to be performed by robot-like equipment. In such an apparatus, a solenoid or pneumatic device could be used to maintain the closure of the holding members. Thus, the testing can be performed in automatic assembly line fashion with resultant saving of the cost of manual labor.

Also, the method and apparatus of the invention can be used to test packages without cavities (i.e., leaded substrates), and the term "package" as used herein is intended to encompass substrates as well as packages with cavities. The packages tested can have leads on any number of sides which can be of any shape, size, and number. The specific structure of the holding device will be designed to accommodate the configuration of the package being tested.

There thus has been described a method and apparatus for non-destructively testing leaded packages. While the invention has been illustrated in connection with preferred embodiments, it should be understood that variations will occur to those skilled in the art, and that the invention to be covered is defined in the claims which are appended hereto.

What is claimed is:

1. A device for testing the adhesion of conductive leads joined to a package, comprising, first and second holding members for holding both the package and a portion of at least one lead therebetween in respective stationary positions, the holding members being capable of being separated from each other for removal and insertion of the package and leads, and of being closed with respect to each other for firmly holding the package and leads held therebetween, each of the first and second holding members having a first discrete region for holding the electrical package therebetween, a second discrete region for holding one lead therebetween and a third discrete region for holding another lead therebetween, said one lead and said another lead being leads which positionally oppose each other across the package, said leads having end regions, said second and third discrete regions of the first and second holding means being situated such that they hold the leads therebetween at the end regions, the first and second holding means being closable with respect to each other by mechanical means linking the first and second holding means with each other, and the first and second holding members each having an elongated cross piece and first, second and third arms extending from the cross piece wherein the ends of such arms comprise the first, second and third discrete regions of the first and second holding means for holding the package and leads.

2. The device of claim 1 wherein the first discrete regions of the first and second holding means are larger than the second and third discrete regions.

3. The device of claim 2 wherein the ends of the arms are flat and are comprised of compliant material.

4. The device of claim 3 wherein the arms of one of the first and second holding members are the same length and wherein the first arm of the other of the first and second holding members is shorter than the second and third arms of such holding member.

5. The device of claim 4 wherein each of the first and second holding members has two threaded projections, one at each end of such member, and wherein said mechanical means includes screws which extend through the projections.

6. An apparatus for testing the adhesion of an electrical lead joined to a package, comprising, means for holding both the package and lead in respective stationary positions, means for applying a force to the lead proximate an area where it is joined to the package, and means for measuring the resistance of the lead to the force, wherein the means for holding comprises first and second holding members capable of being separated from each other to permit insertion and removal of the package and leads, and of being closed with respect to each other such that the package and leads are firmly held therebetween, wherein the first and second holding members each have an elongated cross piece and first, second and third arms extending from the cross piece for holding the electrical package and leads therebetween.

* * * * *